(12) United States Patent
Inomata et al.

(10) Patent No.: US 10,340,429 B2
(45) Date of Patent: Jul. 2, 2019

(54) LIGHT EMITTING DEVICE

(71) Applicants: KOHA CO., LTD., Tokyo (JP); TAMURA CORPORATION, Tokyo (JP); NATIONAL INSTITUTE FOR MATERIALS SCIENCE, Ibaraki (JP)

(72) Inventors: Daisuke Inomata, Tokyo (JP); Hiroaki Sano, Tokyo (JP); Seitaro Yoshida, Tokyo (JP); Kazuo Aoki, Tokyo (JP); Kiyoshi Shimamura, Ibaraki (JP); Encarnacion Antonia Garcia Villora, Ibaraki (JP)

(73) Assignees: KOHA CO., LTD., Tokyo (JP); TAMURA CORPORATION, Tokyo (JP); NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 15/460,621

(22) Filed: Mar. 16, 2017

(65) Prior Publication Data

US 2017/0186923 A1    Jun. 29, 2017

Related U.S. Application Data

(63) Continuation of application No. 14/911,162, filed as application No. PCT/JP2014/071057 on Aug. 8, 2014, now Pat. No. 9,634,216.

(30) Foreign Application Priority Data

Aug. 9, 2013  (JP) ................................. 2013-166920

(51) Int. Cl.
*H01L 33/50* (2010.01)
*H01L 33/64* (2010.01)
(Continued)

(52) U.S. Cl.
CPC .......... *H01L 33/507* (2013.01); *H01L 33/502* (2013.01); *H01L 33/505* (2013.01);
(Continued)

(58) Field of Classification Search
CPC ............................ H01L 33/507; H01L 33/502
See application file for complete search history.

(56) References Cited

U.S. PATENT DOCUMENTS 1,111,111 A * 9/1914 Smith ....................... B68B 5/00
                                                        54/5
8,159,131 B2    4/2012 Helbing
(Continued)

FOREIGN PATENT DOCUMENTS

CN      102376851 A    3/2012
CN      102473819 A    5/2012
(Continued)

OTHER PUBLICATIONS

International Search Report and Written Opinion dated Oct. 14, 2014 issued in PCT/JP2014/071057.
(Continued)

*Primary Examiner* — Matthew E Warren
(74) *Attorney, Agent, or Firm* — Scully, Scott, Murphy & Presser, P.C.

(57) ABSTRACT

According to one embodiment of the present invention, the light emitting device includes an LED element, a side wall which surrounds the LED element, a phosphor layer which is fixed to the side wall with an adhesive layer therebetween, and is positioned above the LED element, and a metal pad as a heat dissipating member. The side wall includes an insulating base which surrounds the LED element and a metal layer which is formed on a side surface at the LED element side of the base, and is in contact with the metal pad and the adhesive layer. The adhesive layer includes a resin
(Continued)

layer that includes a resin containing particles which have higher thermal conductivity than the resin or a layer that includes solder.

14 Claims, 10 Drawing Sheets

(51) Int. Cl.
  *H01L 33/60* (2010.01)
  *H01L 33/62* (2010.01)
  *H01L 25/075* (2006.01)

(52) U.S. Cl.
  CPC .............. *H01L 33/60* (2013.01); *H01L 33/62* (2013.01); *H01L 33/641* (2013.01); *H01L 33/644* (2013.01); *H01L 33/647* (2013.01); *H01L 25/0753* (2013.01); *H01L 33/501* (2013.01); *H01L 33/642* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2924/16195* (2013.01); *H01L 2924/16315* (2013.01)

(56) References Cited

U.S. PATENT DOCUMENTS

| | | | |
|---|---|---|---|
| 8,872,213 B2 | 10/2014 | Yoshida et al. | |
| 9,368,690 B2 | 6/2016 | Ito | |
| 2002/0079837 A1* | 6/2002 | Okazaki | H01L 33/54 313/512 |
| 2004/0104391 A1* | 6/2004 | Maeda | C09K 11/025 257/79 |
| 2007/0108461 A1 | 5/2007 | Shiraishi et al. | |
| 2009/0121615 A1 | 5/2009 | Le Toquin | |
| 2009/0290346 A1 | 11/2009 | Ogawa et al. | |
| 2009/0322197 A1 | 12/2009 | Helbing | |
| 2011/0090703 A1* | 4/2011 | Ishimori | C04B 35/44 362/311.02 |
| 2011/0099264 A1* | 4/2011 | Chapin | H04L 41/12 709/224 |
| 2012/0007130 A1* | 1/2012 | Hoelen | H01L 33/504 257/98 |
| 2012/0012875 A1* | 1/2012 | Ooyabu | H01L 33/507 257/98 |
| 2012/0039064 A1* | 2/2012 | Ooyabu | H01L 33/507 362/84 |
| 2012/0086028 A1* | 4/2012 | Beeson | H01L 33/501 257/98 |
| 2012/0112215 A1* | 5/2012 | Chai | H01L 25/0753 257/89 |
| 2012/0138998 A1 | 6/2012 | Itou et al. | |
| 2012/0153316 A1 | 6/2012 | Helbing | |
| 2012/0195340 A1 | 8/2012 | Cheon et al. | |
| 2012/0224372 A1 | 9/2012 | Ogawa et al. | |
| 2013/0003346 A1* | 1/2013 | Letoquin | H05B 33/0803 362/84 |
| 2013/0146912 A1 | 6/2013 | Su et al. | |
| 2013/0200785 A1 | 8/2013 | Yano et al. | |
| 2013/0213697 A1 | 8/2013 | Palaniswamy et al. | |
| 2013/0341666 A1 | 12/2013 | Yoshida et al. | |
| 2014/0021503 A1* | 1/2014 | Yoshida | H01L 33/507 257/98 |
| 2014/0028173 A1* | 1/2014 | Tsuchiya | F21V 29/004 313/46 |
| 2014/0264359 A1* | 9/2014 | Zimmerman | H01L 33/64 257/76 |
| 2014/0299902 A1* | 10/2014 | Zimmerman | H01L 33/62 257/98 |
| 2016/0049567 A1 | 2/2016 | Palaniswamy et al. | |
| 2016/0056349 A1* | 2/2016 | Cui | H01L 33/508 257/98 |
| 2016/0064628 A1* | 3/2016 | Fujii | H05K 1/0274 257/98 |
| 2016/0190418 A1* | 6/2016 | Inomata | H01L 33/507 257/98 |
| 2017/0137706 A1* | 5/2017 | Fujita | C09K 11/08 |
| 2017/0160627 A1* | 6/2017 | Ikesue | G03B 21/204 |
| 2017/0186923 A1* | 6/2017 | Inomata | H01L 33/507 |
| 2017/0194297 A1* | 7/2017 | Kuriki | H01L 27/156 |
| 2017/0241598 A1* | 8/2017 | Jiang | F21K 9/237 |
| 2017/0307968 A1* | 10/2017 | Nagasaki | G03B 21/204 |

FOREIGN PATENT DOCUMENTS

| | | |
|---|---|---|
| EP | 2 128 906 A1 | 2/2009 |
| EP | 2 124 255 A1 | 11/2009 |
| EP | 2 472 613 A1 | 7/2012 |
| JP | 2003-347601 A | 12/2003 |
| JP | 2007-200727 A | 8/2007 |
| JP | 2007-327815 A | 12/2007 |
| JP | 2008-21973 A | 1/2008 |
| JP | 2008-153466 A | 7/2008 |
| JP | 2010-003674 A | 1/2010 |
| JP | 2012-502449 A | 1/2012 |
| JP | 2012-039031 A | 2/2012 |
| JP | 2012-099315 A | 5/2012 |
| JP | 2012-212850 A | 11/2012 |
| JP | 2013-004814 A | 1/2013 |
| JP | 2013-38215 A | 2/2013 |
| WO | WO 2011/024934 A1 | 3/2011 |
| WO | 2012/061182 A1 | 5/2012 |
| WO | WO 2012/057330 A1 | 5/2012 |
| WO | 2012/131792 A1 | 10/2012 |

OTHER PUBLICATIONS

Extended European Search Report dated Jan. 4, 2017 issued in EP 14834996.2.
International Preliminary Report on Patentability and Written Opinion dated Feb. 18, 2016 from related PCT/JP2014/071057.
Notice of Allowance dated Dec. 2, 2016 from related U.S. Appl. No. 14/911,162.
Chinese Office Action dated May 16, 2018 received in Chinese Patent Application No. 201480042506.7, together with an English-language translation.
Japanese Office Action dated Jul. 31, 2018 received in Japanese Patent Application No. 2015-530984, together with an English-language translation.
Chinese Office Action dated Sep. 4, 2017 issued in corresponding Chinese Patent Appln. No. 201480042506.7 with English translation.
Japanese Office Action dated Mar. 12, 2019 received in Japanese Application No. 2015-530984, together with an English-language translation.

* cited by examiner

LIGHT EMITTING DEVICE

TECHNICAL FIELD

The invention relates to a light-emitting device.

BACKGROUND ART

As a conventional light-emitting device, a device is known that is provided with a cover formed of a synthetic resin mixed with phosphor above a light-emitting diode such that white light is produced by combining a light emitted from the light-emitting diode with a fluorescence emitted from the phosphor which absorbs a portion of the light emitted from light-emitting diode (see e.g., PTL 1).

PTL 1 states that the light-emitting device disclosed in PTL 1 is less likely to cause deterioration due to light or heat from the light-emitting diode so that the light-emitting device can have a long life since the cover formed of a synthetic resin including phosphor is away from the light-emitting diode.

CITATION LIST

Patent Literature

[PTL 1]
JP-A-2003-347601

SUMMARY OF INVENTION

Technical Problem

The phosphor absorbs a light emitted from a light-emitting element, so that it generates heat due to a difference (i.e., a difference in energy) between a wavelength of the light from the light-emitting element and a wavelength of fluorescence. For example, if a quantum efficiency of the phosphor in wavelength conversion is 1, about 20% of absorbed energy is converted into heat upon absorbing a blue light with a wavelength of 450 nm and emitting a yellow fluorescence with a wavelength of 560 nm, and about 30% of absorbed energy is converted into heat upon absorbing a blue light with a wavelength of 450 nm and emitting a red fluorescence with a wavelength of 650 nm. In fact, since the quantum efficiency of the phosphor is less than 1, more energy is converted into heat.

On the other hand, the phosphor has such a thermal quenching property that the amount of light emitted decreases with an increase in temperature. The magnitude of the thermal quenching has a direct effect on the luminous efficiency of a light-emitting device. Therefore, it is very important to prevent a temperature rise of the phosphor in use to reduce the thermal quenching as much as possible such that the light-emitting device using the phosphor can have a high luminous efficiency. The temperature rise of the phosphor further leads to a variation in absorbance of light emitted from the light-emitting element, a variation in fluorescence spectrum, resulting a variation in emission color of the light-emitting device. It is important to prevent the temperature rise of the phosphor to reduce a variation in color in any usage state or use environment. For example, temperature during emission of the phosphor is desirably less than 100° C.

The light-emitting device disclosed in PTL 1 is however difficult to operate so as to efficiently transfer heat generated by the phosphor to a peripheral portion thereof since the thermal conductivity of the cover formed of the synthetic resin and the phosphor mixed therein is low. In addition, it is not provided with a heat dissipating member for effectively dissipating heat generated by the phosphor. Furthermore, even if provided with the heat dissipating member, the cover formed of the synthetic resin and the phosphor mixed therein is not in contact with any high thermal conductivity members. Thus, it is difficult to efficiently transfer heat generated by the phosphor to the heat dissipating member. For this reason, if the light-emitting device disclosed in PTL 1 is applied to a lighting apparatus such as a projector which requires high brightness and high light intensity, it may be impossible to prevent the temperature rise of the phosphor, causing large thermal quenching.

Thus, it is an object of the invention to provide a light-emitting device that is suited to a lighting apparatus such as a projector which requires high brightness and high light intensity, exhibits little variation in light emission color and a slight reduction in light emission intensity in use, and uses a remote phosphor.

Solution to Problem

According to one embodiment of the invention, a light-emitting device set forth in [1] to [20] below is provided so as to achieve the above object.

[1] A light-emitting device, comprising:
a light-emitting element that emits a light with a peak wavelength of not more than 480 nm;
a phosphor layer that is operable to convert a wavelength of the light emitted from the light-emitting element; and
a heat dissipating member that dissipates heat generated in the phosphor layer,
wherein the phosphor layer comprises a layer comprising a single crystal phosphor, a ceramic phosphor, a glass including a phosphor particle, a layer comprising a transparent substrate and a phosphor particle-including resin layer formed thereon,
wherein the phosphor layer comprises a layer covering upper and lateral sides of the light-emitting element and being directly connected to the heat dissipating member, or a layer covering the upper side of the light-emitting element and being connected via an adhesive layer to a sidewall surrounding the light-emitting element,
wherein the sidewall comprises a first sidewall or a second sidewall,
wherein the first sidewall comprises an insulating base surrounding the light-emitting element and a metal layer that is formed on a side surface at the light-emitting element side of the base and is in contact with the heat dissipating member and the adhesive layer,
wherein the second sidewall comprises a ceramic or a metal in contact with the heat dissipating member and the adhesive layer, and
wherein the adhesive layer comprises a resin layer comprising a resin and a particle having a higher thermal conductivity than the resin, or a layer comprising a solder.

[2] The light-emitting device according to [1], wherein the phosphor layer comprises a layer connected to the sidewall via the adhesive layer,
wherein the heat dissipating member comprises a metal pad to be electrically connected to the light-emitting element, and wherein the sidewall comprises the first sidewall, or the second sidewall comprising the ceramic.

[3] The light-emitting device according to [1], wherein the phosphor layer comprises a layer connected to the sidewall via the adhesive layer,
wherein the sidewall comprises the second sidewall comprising the metal, and
wherein the light-emitting element is insulated from the heat dissipating member.

[4] The light-emitting device according to any one of [1] to [3], wherein the phosphor layer comprises a layer connected to the sidewall via the adhesive layer, and
wherein the heat dissipating member comprises a member comprising a same material as the base of the first sidewall comprising a ceramic and formed integrally with the base of the first sidewall, or a member comprising a same material as the second sidewall and formed integrally with the second sidewall.

[5] The light-emitting device according to any one of [1] to [3], wherein the phosphor layer comprises a layer connected to the sidewall via the adhesive layer, and
the heat dissipating member comprises a reflector that is in contact with the base of the first sidewall comprising a ceramic or with the second sidewall and has an opening above the light-emitting element.

[6] The light-emitting device according to any one of [1] to [3], wherein the heat dissipating member comprises a heat sink located under the light-emitting element.

[7] The light-emitting device according to any one of [1] to [3], further comprising a light-emitting element-heat dissipating member to dissipate heat of the light-emitting element,
wherein the heat dissipating member is thermally separated from the light-emitting element-heat dissipating member.

[8] The light-emitting device according to any one of [1] to [3], wherein a base material of the transparent substrate comprises glass, gallium oxide, zinc oxide, sapphire, silicon carbide or diamond.

[9] The light-emitting device according to any one of [1] to [3], wherein the transparent substrate has a thermal conductivity of not less than 1 W/(m·K) and a transmittance of not less than 80% with respect to an emission wavelength of the light-emitting element and a fluorescence wavelength.

[10] The light-emitting device according to any one of [1] to [3], wherein the phosphor particles comprise a particle of a single crystal phosphor.

[11] The light-emitting device according to any one of [1] to [3], wherein the phosphor layer comprises a layer connected to the sidewall via the adhesive layer,
wherein the phosphor layer comprises a metal film on a surface at a portion in contact with the adhesive layer, and
wherein the adhesive layer comprises a solder.

[12] The light-emitting device according to any one of [1] to [3], wherein the phosphor layer comprises a layer connected to the sidewall via the adhesive layer, and
wherein the phosphor layer comprises a concavo-convex pattern that has a depth of not less than 10% of a thickness of the phosphor layer and is formed on a surface on the light-emitting element side at a portion in contact with the adhesive layer.

[13] The light-emitting device according to any one of [1] to [3], wherein the phosphor layer comprises a layer connected to the sidewall via the adhesive layer, and
wherein the sidewall is fixed to the heat dissipating member by a screw.

[14] The light-emitting device according to any one of [1] to [3], wherein the phosphor layer comprises a layer connected to the sidewall via the adhesive layer, and
wherein the adhesive layer has a thermal conductivity of not less than 3 W/(m·K).

[15] The light-emitting device according to [1], wherein the phosphor layer comprises a layer directly connected to the heat dissipating member, and
wherein the light-emitting device further comprises a structure that the lower portion of the phosphor layer is fitted to a groove formed on an upper surface of the heat dissipating member, a structure that a threaded groove formed on a side surface of the groove on the upper surface of the heat dissipating member is screw-fixed to a threaded groove formed on a side surface of the lower portion of the phosphor layer, or a structure that a threaded groove formed on the side surface of the upper portion of the heat dissipating member is screw-fixed to a threaded groove formed on an inner side surface of the lower portion of the phosphor layer.

[16] The light-emitting device according to any one of [1] to [3], wherein a radiation flux density of light emitted from the light-emitting element and incident on the phosphor layer is not less than 1.8 W/cm$^2$.

[17] The light-emitting device according to any one of [1] to [3], wherein a rate of an area of the lower surface of the phosphor layer at a portion in contact with the adhesive layer with respect to an area of a region contributing to wavelength conversion is not less than 35%.

[18] The light-emitting device according to [17], wherein the rate is not less than 70%.

[19] The light-emitting device according to any one of [1] to [3], wherein the phosphor layer is a layer comprising a transparent substrate and a phosphor particle-including resin layer formed thereon, and
wherein a mass concentration of the phosphor particles in the resin layer is not less than 50 mass %.

[20] The light-emitting device according to [19], wherein the mass concentration is not less than 57 mass %.

Advantageous Effects of the Invention

According to the invention, a light-emitting device can be provided that is suited to a lighting apparatus such as a projector which requires high brightness and high light intensity, exhibits little variation in light emission color and a slight reduction in light emission intensity in use, and uses a remote phosphor.

DESCRIPTION OF EMBODIMENTS

First Embodiment (Configuration of Light-Emitting Device)

Figure 1A:
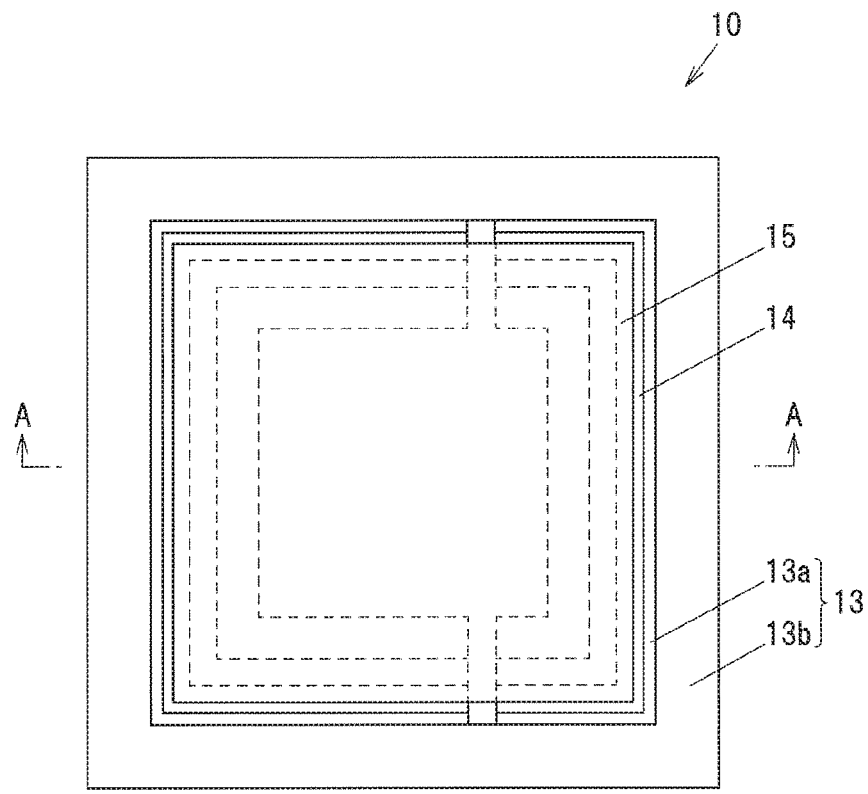
FIG. 1A is a top view showing a light-emitting device in a first embodiment.
Figure 1B:
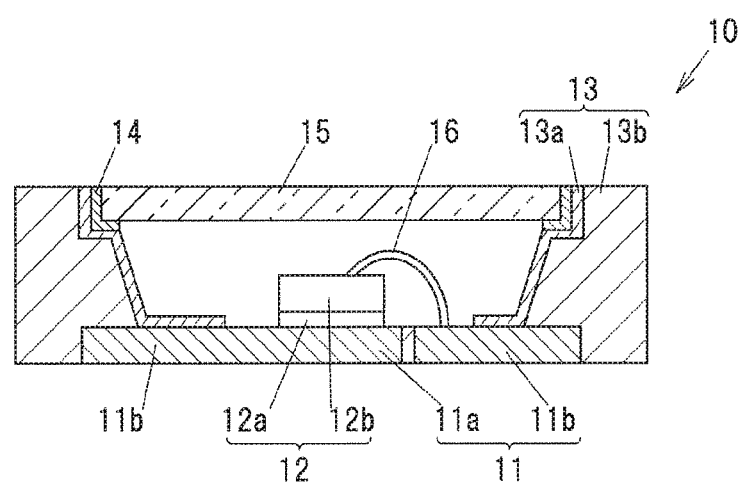
FIG. 1B is a vertical cross sectional view showing the light-emitting device taken along a line A-A in FIG. 1A.

FIG. 1A is a top view showing a light-emitting device in the first embodiment. FIG. 1B is a vertical cross sectional view showing the light-emitting device taken along the line A-A in FIG. 1A. A light-emitting device 10 is a light-emitting device using a remote phosphor. Here, the remote phosphor is a technique in which a phosphor layer is placed away from a light-emitting element in a light-emitting device.

The light-emitting device 10 has a metal pad 11, an LED element 12 mounted on the metal pad 11, a sidewall 13 surrounding the LED element 12, and a phosphor layer 15 which is fixed to the sidewall 13 via an adhesive layer 14 so as to cover the upper side of the LED element 12 and can convert a wavelength of light emitted from the LED element 12.

The sidewall 13 has an insulating base 13b surrounding the LED element 12, and a metal layer 13a formed on a side surface of the base 13b on the LED element 12 side. A dotted line in FIG. 1A indicates the position of the metal layer 13a below the phosphor layer 15.

The metal pad 11 is a member formed of a metal such as Cu or Al, and power is externally supplied to the LED element 12 via the metal pad 11. The metal pad 11 is, e.g., a lead frame. The metal pad 11 has a region 11a and a region 11b which are electrically separated from each other.

The LED element 12 emits light with a peak wavelength of not more than 480 nm. When using a light-emitting element having such a short emission wavelength, the Stokes loss associated with wavelength conversion by phosphor is large and the phosphor generates a large amount of heat. Therefore, it is important to effectively dissipate heat generated in the phosphor layer 15.

The LED element 12 is a face-down type LED chip and has a substrate 12b and a crystal layer 12a. The substrate 12b is a conductive substrate such as SiC substrate, GaN substrate or gallium oxide substrate. The crystal layer 12a is a layer formed on the substrate 12b by epitaxial growth and has a light-emitting layer sandwiched between an n-type semiconductor layer and a p-type semiconductor layer. A material used for the crystal layer 12a is, e.g., an InGaN-based crystal, a GaN-based crystal, an AlGaN-based crystal or an AlN-based crystal, depending on the emission wavelength of the LED element 12.

The LED element 12 is electrically connected to the region 11b and the region 11a of the metal pad 11 via a wire 16 connected to the substrate 12b and an electrode (not shown) formed on the bottom surface of the crystal layer 12a. The wire 16 is formed of, e.g., Au, Al, Ag or Cu.

Although one LED element 12 is shown in FIG. 1, the light-emitting device 10 may have plural LED elements 12. In this case, an electrical connection between the plural LED elements may be a series circuit, a parallel circuit, or a series-parallel combination circuit.

The present embodiment is particularly effective when a radiation flux density is large (e.g., not less than 1.8 W/cm$^2$) and heat is likely to be generated in the phosphor layer 15, since heat generated in the phosphor layer 15 can be efficiently dissipated as described later. Here, a light radiation flux density is a radiation flux density of light emitted from the LED element 12 and incident on the phosphor layer 15 and is obtained by dividing the total radiation flux [W] of the LED element 12 by an area [cm$^2$] of a region of the phosphor layer 15 contributing to wavelength conversion.

A face-up type LED element may be alternatively used instead of the LED element 12. An LED element may be, e.g., a so-called peeling type having a structure in which a light-emitting layer portion epitaxially grown on a sapphire substrate and then physically peeled off from the sapphire substrate is attached to a conductive substrate such as Si substrate or CuW substrate.

Alternatively, a substrate of the LED element may not be conductive. In such a case that the substrate is not conductive in the face-up type, a P-electrode and an N-electrode of the LED element are respectively electrically connected to metal pads having corresponding polarities via different conductive wires.

Meanwhile, a LED element in case of a flip-chip type is connected to the metal pad 11 via, e.g., conductive bumps respectively connected to the n-type semiconductor layer and the p-type semiconductor layer of the crystal layer. As such, the effects of the present embodiment can be obtained regardless of the type of the LED element. Alternatively, a still another light-emitting element such as laser element may be used instead of the LED element 12.

The base 13b of the sidewall 13 is formed of, e.g., a thermosetting resin such as silicone resin or epoxy resin, or a ceramic such as $Al_2O_3$, AlN, $Si_3N_4$ or BN. The metal layer 13a as a surface of the sidewall 13 is formed of a metal having a high thermal conductivity and a high reflectance, and preferably, is formed of Ag or Al or is a layer in which highly reflective Ag is formed on a surface of Cu. The metal layer 13a is formed by, plating or deposition on a surface of the base formed by press work. The metal layer 13a is, e.g., a part of a package of the light-emitting device 10.

The metal layer 13a is in contact with the metal pad 11 and the adhesive layer 14, and thus can transfer heat, which is generated in the phosphor layer 15 and is transferred to the adhesive layer 14, to the metal pad 11. In addition, the metal layer 13a, when a portion thereof is directly in contact with the phosphor layer 15, can directly receive heat of the phosphor layer 15 and transfer the heat to the metal pad 11. The metal pad 11 serves as a heat dissipating member and is capable of dissipating heat to the outside.

Here, as indicated by solid and dotted lines in FIG. 1A, the metal layer 13a has at least two electrically-separated regions each of which is in contact with either the region 11a or the region 11b of the metal pad 11. This is to prevent the metal layer 13a from causing a short circuit of the LED element 12.

The adhesive layer 14 is formed of a resin including particles such as high thermal conductivity grease or high thermal conductivity paste, or a solder. High thermal conductivity herein means a thermal conductivity of not less than 1 W/m·K. The particles included in the resin may be any of metal particles, semiconductor particles or insulating particles, but need to have a higher thermal conductivity than the resin since the particles are added to improve thermal conductivity of the adhesive layer 14. Therefore, the thermal conductivity of the particles needs to be not less than 1. A material of the insulating particles having high thermal conductivity is, e.g., a highly covalent material such as silica and diamond. The high thermal conductivity grease when used is a silicone oil mixture including particles of silica, etc., and the high thermal conductivity paste is a thermosetting resin including particles of Ag, etc.

The adhesive layer 14 only needs to be formed in at least part of a region between the peripheral portion of the phosphor layer 15 and the sidewall 13, but is preferably formed in the entire region in contact with the metal layer 13a to provide a larger heat dissipation path from the phosphor layer 15 and thereby to increase heat dissipation from the phosphor layer 15. In this regard, however, the adhesive layer 14 does not electrically connect between plural separate regions of the sidewall 13. This is to prevent the metal layer 13a and the adhesive layer 14 from causing a short circuit of the LED element 12.

The phosphor layer 15 is formed of a single crystal phosphor, a ceramic phosphor or glass including phosphor particles. As the single crystal phosphor, it is possible to use, e.g., a garnet-based single crystal phosphor, typified by YAG:Ce (Yttrium Aluminum Garnet) disclosed in WO 2012/057330. As the ceramic phosphor, it is possible to use, e.g., a garnet-based ceramic phosphor, typified by YAG:Ce. As the glass including phosphor particles, it is possible to use, e.g., a low-melting-point glass.

Since the single crystal phosphor, the ceramic phosphor and the glass including phosphor particles have a higher thermal conductivity than a transparent resin including phosphor particles, heat generated in the phosphor layer 15, particularly heat at the center portion at which a temperature rise is large, can be efficiently transferred to the peripheral portion and the heat thus can be efficiently dissipated to the heat dissipating member through the high thermal conductivity adhesive layer 14 and the sidewall 13. As a result, it is possible to suppress a temperature rise of the phosphor layer and thermal quenching is thus less likely occur. For example, as compared to a silicon resin as a transparent resin which has a thermal conductivity of about 0.1 W/(m·K), a YAG:Ce single crystal phosphor and a YAG:Ce ceramic phosphor each having a thermal conductivity of about 10 W/(m·K) and a low-melting-point glass having a thermal conductivity of about 1 W/(m·K) exhibit 10 to 100 times of heat conduction capacity and are thus capable of efficiently transferring heat to the peripheral portion of the phosphor layer 15.

In addition, the phosphor layer 15 desirably has a transmittance of not less than about 80% at an emission wavelength of the LED element 12 and at a fluorescence wavelength of the phosphor layer 15 so that light of the LED element 12 and fluorescence as light wavelength-converted in the phosphor layer 15 can be efficiently extracted to the outside.

Furthermore, a single crystal phosphor grown from a melt exhibits smaller thermal quenching than particles of phosphor manufactured by conventional sintering. Therefore, the single crystal phosphor is particularly preferable as a material of the phosphor layer 15.

Heat generated in the high thermal conductivity phosphor layer 15 is efficiently transferred to the peripheral portion of the phosphor layer 15, is then transmitted through the adhesive layer 14, the metal layer 13a and the metal pad 11 each having a high thermal conductivity, and is efficiently dissipated mainly from the metal pad 11 or a heat dissipating member (not shown) connected to the metal pad 11. As such, by efficiently dissipating heat of the phosphor layer 15, it is possible to suppress a temperature rise of the phosphor layer 15 and thus possible to suppress a decrease in light intensity and variation in emission color of the light-emitting device 10.

In case of converting a wavelength of highly bright and intense light of which light radiation flux density is not less than 1.8 W/cm$^2$, the phosphor layer 15 generates a larger amount of heat. Therefore, it is important to effectively dissipate heat generated in the phosphor layer 15. Here, the area to be a denominator to calculate the light radiation density is an area of the phosphor layer 15 at a portion contributing to wavelength conversion, e.g., an area of the lower surface of the phosphor layer 15 at a portion exposed on the LED element 12 side.

The thickness of the phosphor layer 15 is, e.g., 1 mm. In this regard, it is more difficult to dissipate heat with a smaller thickness. Therefore, it is important to efficiently dissipate heat generated in the phosphor layer 15 by using the method of the present embodiment.

Second Embodiment

The second embodiment is different from the first embodiment in the configuration of the sidewall. Note that, the explanation of the same features as those in the first embodiment will be omitted or simplified.

(Configuration of Light-Emitting Device)

Figure 2:
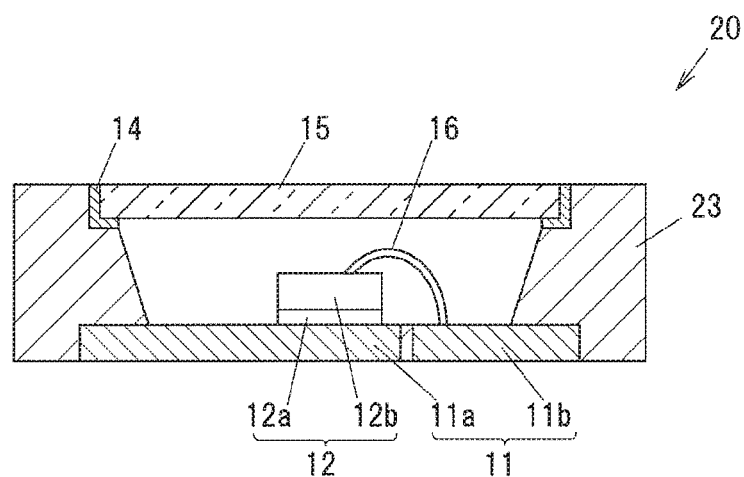
FIG. 2 is a vertical cross sectional view showing a light-emitting device in a second embodiment.

FIG. 2 is a vertical cross sectional view showing a light-emitting device in the second embodiment. A light-emitting device 20 has the metal pad 11, the LED element 12 mounted on the metal pad 11, a sidewall 23 surrounding the LED element 12, and the phosphor layer 15 fixed to the sidewall 23 via the adhesive layer 14 and located above the LED element 12.

The sidewall 23 is formed of a ceramic, such as $Al_2O_3$, AlN, $Si_3N_4$ or BN, having a higher thermal conductivity than a resin material. $Al_2O_3$, AlN, $Si_3N_4$ and BN respectively have a thermal conductivity of about 30 W/(m·K), about 170 W/(m·K), about 90 W/(m·K) and about 60 W/(m·K). The sidewall 23 is, e.g., a part of a package of the light-emitting device 20.

The heat generated in the phosphor layer 15 is transmitted through the high thermal conductivity adhesive layer 14 and the sidewall 23, and is also dissipated from the sidewall 23. In addition, when a portion of the sidewall 23 is directly in contact with the phosphor layer 15, the sidewall 23 can directly receive and dissipate heat of the phosphor layer 15. Meanwhile, when the sidewall 23 is in contact with the metal pad 11, the heat is also dissipated from the metal pad 11 or a heat dissipating member (not shown) connected to the metal pad 11. Therefore, it is possible to efficiently dissipate heat of the phosphor layer 15 and thus possible to suppress a decrease in light intensity and variation in emission color of the light-emitting device 20, in the same manner as in the first embodiment.

Figure 3A:
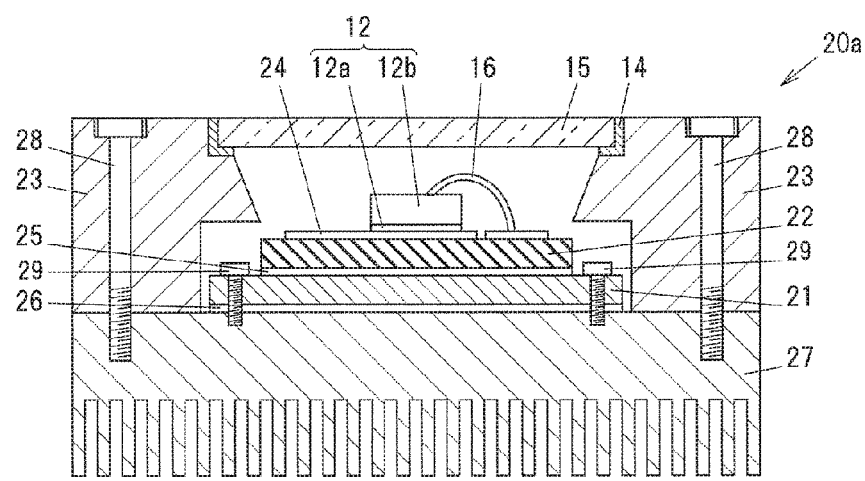
FIG. 3A is a vertical cross sectional view showing a modification of the light-emitting device in the second embodiment.
Figure 3B:
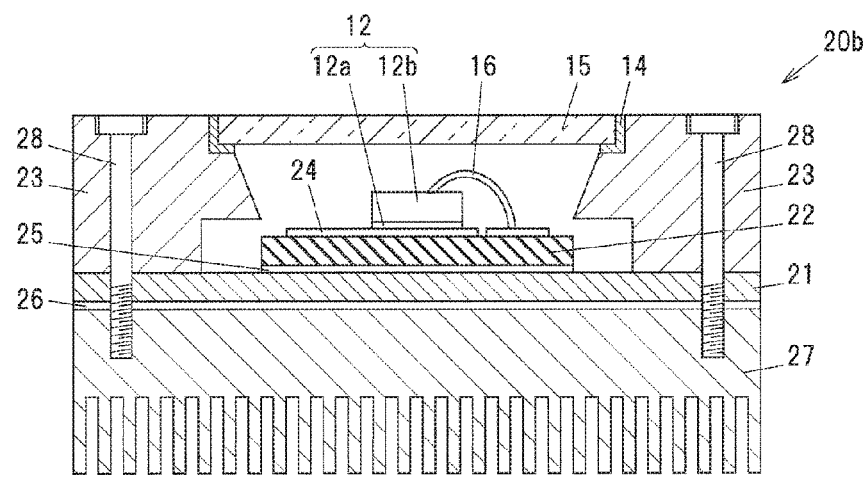
FIG. 3B is a vertical cross sectional view showing another modification of the light-emitting device in the second embodiment.

FIGS. 3A and 3B are vertical cross sectional views showing modifications of the light-emitting device in the second embodiment. In a light-emitting device 20*a* shown in FIG. 3A and a light-emitting device 20*b* shown in FIG. 3B, the sidewall 23 is formed of a metal.

The light-emitting device 20*a* in FIG. 3A has a metal plate 21, an insulating substrate 22 placed on the metal plate 21, the LED element 12 mounted on the insulating substrate 22, the sidewall 23 surrounding the LED element 12, the phosphor layer 15 fixed to the sidewall 23 via the adhesive layer 14 and located above the LED element 12, and a heat dissipating member 27 such as heat sink in contact with the bottom surface of the sidewall 23.

The insulating substrate 22 is fixed onto the metal plate 21 by an adhesive layer 25. The insulating substrate 22 is formed of an insulating material having a high thermal conductivity such as AlN. The adhesive layer 25 is formed of, e.g., a SnAgCu-based solder or an AuSn-based solder, etc.

A wiring pattern 24 formed of a metal such as Ag or Au is formed on the upper surface of the insulating substrate 22. The LED element 12 is connected to the wiring pattern 24 via the wire 16 and an electrode (not shown) formed on the bottom surface of the crystal layer 12*a*. The LED element 12 is insulated from the metal plate 21 by the insulating substrate 22. In addition, a wire covered with an insulating film (not shown) running from the outside into the light-emitting device 20*a* through a groove or a hole provided on the sidewall 23 is connected to the wiring pattern 24 and power is supplied to the LED element 12 through the wire.

The metal plate 21 is formed of a high thermal conductivity metal such as Cu. The metal plate 21 is fixed to the heat dissipating member 27 by, e.g., screws 29. A high thermal conductivity grease 26 is applied between the metal plate 21 and the heat dissipating member 27. Alternatively, a heat dissipating sheet may be used instead of the high thermal conductivity grease 26. It is also possible to use a high thermal conductivity paste or a solder instead of the high thermal conductivity grease 26 and, in such a case that bond strength between the metal plate 21 and the heat dissipating member 27 is sufficient, it is not necessary to use the screws 29. The high thermal conductivity paste is, e.g., a thermosetting resin which includes particles or nanoparticles of a metal such as Ag.

The sidewall 23 is formed of a metal such as Ag or Al. The sidewall 23 may be formed of, e.g., Cu of which surface is plated with highly reflective Ag. The sidewall 23 is not in contact with the wiring pattern 24 to prevent a short circuit.

The sidewall 23 is in contact with the heat dissipating member 27 and the adhesive layer 14 so that heat generated in the phosphor layer 15 and transferred to the adhesive layer 14 can be transferred to the heat dissipating member 27. In addition, the sidewall 23, when a portion thereof is directly in contact with the phosphor layer 15, can directly receive heat of the phosphor layer 15 and transfer the heat to the heat dissipating member 27. The sidewall 23 is fixed to the heat dissipating member 27 by screws 28.

The light-emitting device 20*b* in FIG. 3B is different from the light-emitting device 20*a* in that the metal plate 21 has a larger area and the sidewall 23 is fixed to the heat dissipating member 27 by the screws 28 via the metal plate 21. In the light-emitting device 20*b*, heat transferred from the phosphor layer 15 to the sidewall 23 is transferred to the heat dissipating member 27 via the metal plate 21. In the light-emitting device 20*b*, the metal plate 21 and the high thermal conductivity grease 26 have a thermal conductivity of not less than 1 W/m·K and thus can be regarded as a part of the heat dissipating member. In other words, the metal plate 21, the high thermal conductivity grease 26 and the heat dissipating member 27 constitute one heat dissipating member.

Figure 4A:
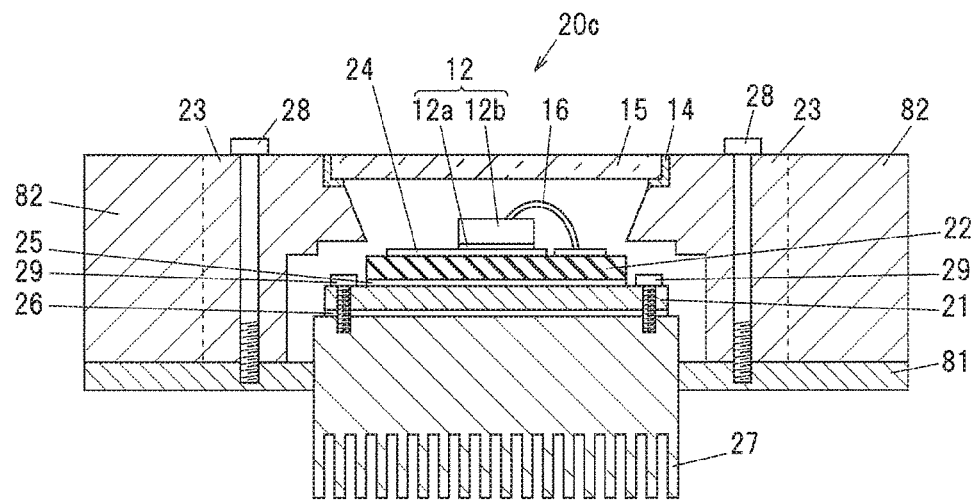
FIG. 4A is a vertical cross sectional view showing another modification of the light-emitting device in the second embodiment.
Figure 4B:
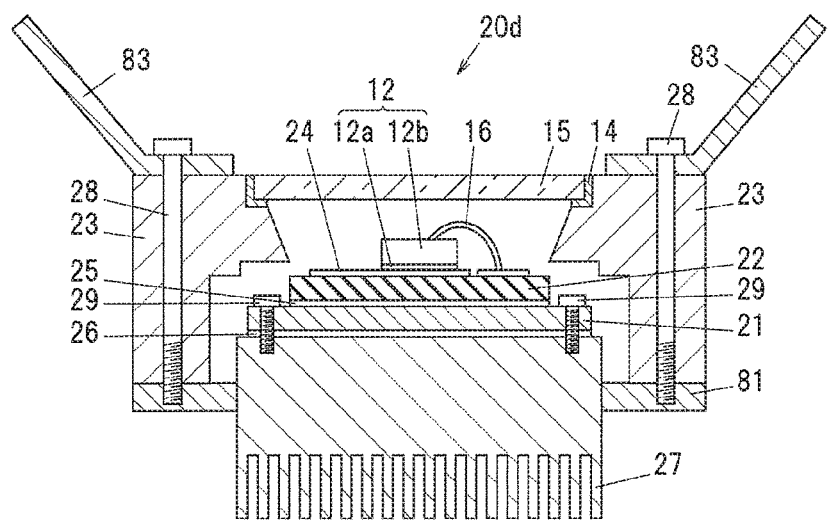
FIG. 4B is a vertical cross sectional view showing another modification of the light-emitting device in the second embodiment.

FIGS. 4A and 4B are vertical cross sectional views showing modifications of the light-emitting device in the second embodiment. In a light-emitting device 20*c* shown in FIG. 4A and a light-emitting device 20*d* shown in FIG. 4B, the sidewall 23 is formed of a metal.

The light-emitting device 20*c* in FIG. 4A has the metal plate 21, the insulating substrate 22 placed on the metal plate 21, the LED element 12 mounted on the insulating substrate 22, the sidewall 23 surrounding the LED element 12, the phosphor layer 15 fixed to the sidewall 23 via the adhesive layer 14 and located above the LED element 12, the heat dissipating member 27 such as heat sink, and a heat dissipating member 82 provided on the outer side of the sidewall 23.

The sidewall 23 and the heat dissipating member 27 are fixed to a housing 81. The housing 81 shown in FIG. 4A is a portion of a housing of a lighting apparatus which is provided with the light-emitting device 20*c*.

The heat dissipating member 27 is fixed to the housing 81 by, e.g., screw-fixing L-shaped fasteners (not shown) or by using an epoxy-based adhesive. The heat dissipating member 27 of the light-emitting device 20*c* is used mainly for releasing heat generated by the LED element 12.

The sidewall 23 is fixed to the housing 81 by, e.g., the screws 28. Alternatively, the sidewall 23 may be fixed to the housing 81 using an epoxy-based adhesive, etc., instead of the screws 28.

The sidewall 23 and the heat dissipating member 82 of the light-emitting device 20*c* are formed of a metal or a ceramic. The heat dissipating member 82 is, e.g., a member made of the same material as the sidewall 23 and integrally formed with the sidewall 23. In other words, the outer side of a wide sidewall which includes the sidewall 23 on the inner side is used as the heat dissipating member 82.

Alternatively, the heat dissipating member 82 may be made of a different material from the sidewall 23 and formed independently. In this case, the heat dissipating member 82 is, e.g., connected to the sidewall 23 via an adhesive member. The adhesive member is formed of a material such as a resin including particles having a high thermal conductivity of, e.g., not less than 1 W/(m·K) such as high thermal conductivity grease or high thermal conductivity paste, or a solder, etc.

In addition, the heat dissipating member 82 may have a structure in which the surface has fins in the same manner as the heat dissipating member 27.

The sidewall 23 is in contact with the heat dissipating member 82 so that heat generated in the phosphor layer 15 and transferred to the adhesive layer 14 can be transferred to the heat dissipating member 82. In addition, the sidewall 23, when a portion thereof is directly in contact with the phosphor layer 15, can directly receive heat of the phosphor layer 15 and transfer the heat to the heat dissipating member 82.

The light-emitting device 20*d* in FIG. 4B is different from the light-emitting device 20*c* in that a heat dissipating member 83 as a reflector is used instead of the heat dissipating member 82. The heat dissipating member 83 is a reflector having an opening above the LED element 12 and reflecting light emitted from the LED element 12 and transmitted through the phosphor layer 15, and is fixed to the sidewall 23.

The heat dissipating member 83 is formed of a metal or a ceramic. The heat dissipating member 83 is fixed onto the upper surface of the sidewall 23 by the screws 28 via, e.g., a high thermal conductivity grease or TIM (Thermal Interface Material). The heat dissipating member 83 may be made of the same material as the sidewall 23 and integrally formed with the sidewall 23. In addition, the sidewall 23 may have a structure in which the surface has fins in the same manner as the heat dissipating member 27.

If the heat dissipation path from the LED element 12 is thermally connected to the heat dissipation path from the phosphor layer 15, the phosphor layer 15 may be affected by heat generation of the LED element 12. In the light-emitting device 20c and the light-emitting device 20d, the heat dissipating member 27 is thermally separated from the heat dissipating member 83 and the heat dissipation path from the LED element 12 is thus thermally separated from the heat dissipation path from the phosphor layer 15. Therefore, it is possible to suppress a temperature rise of the phosphor layer 15 more effectively.

The heat dissipating member 82 of the light-emitting device 20c or the heat dissipating member 83 of the light-emitting device 20d may be applied to the light-emitting device 20 and also may be applied to the light-emitting device 10 in the first embodiment. In case of applying to the light-emitting device 10, the base 13b of the sidewall 13 needs to be formed of a ceramic having a high thermal conductivity such as $Al_2O_3$, AlN, $Si_3N_4$ or BN, and the heat dissipating member 82 or the heat dissipating member 83 is integrally formed with the base 13b of the sidewall 13 or is connected to the base 13b of the sidewall 13.

Third Embodiment

The third embodiment is different from the first embodiment in the configuration of the phosphor layer. Note that, the explanation of the same features as those in the first embodiment will be omitted or simplified.

(Configuration of Light-Emitting Device)

Figure 5:
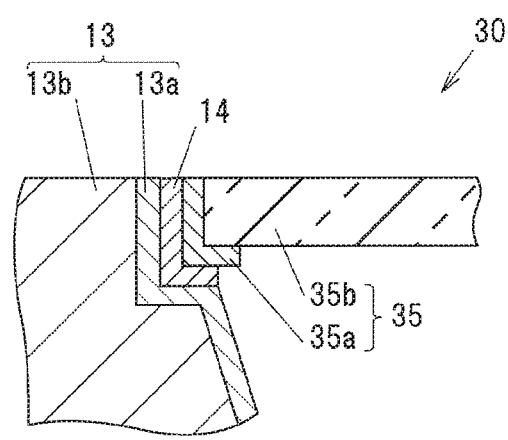
FIG. 5 is a partially enlarged vertical cross sectional view showing a light-emitting device in a third embodiment.

FIG. 5 is a partially enlarged vertical cross sectional view showing a light-emitting device in the third embodiment. A light-emitting device 30 has the metal pad 11, the LED element 12 mounted on the metal pad 11, the sidewall 13 surrounding the LED element 12 and having the metal layer 13a on a side surface on the LED element 12 side, and a phosphor layer 35 which is fixed to the metal layer 13a of the sidewall 13 via the adhesive layer 14, has a metal film 35a on a surface at a portion in contact with the adhesive layer 14 and is located above the LED element 12. The configuration of the light-emitting device 30 is the same as that of the light-emitting device 10 in the first embodiment, except the phosphor layer.

A fluorescent portion 35b of the phosphor layer 35 is formed of the same material and is of the same shape as the phosphor layer 15 in the first embodiment. The metal film 35a of the phosphor layer 35 is formed of a metal such as Au, Ag, Pd, Pt, Sn, Ni, Cr or Fe, or an alloy including thereof. Highly reflective Ag or an alloy including Ag is particularly preferable. The metal film 35a is formed by, e.g., sputtering or deposition.

The metal film 35a is provided on the phosphor layer 35 and the adhesive layer 14 adheres to the metal film 35a. Solders have a high thermal conductivity (e.g., about 60 W/(m·K) in case of $Sn_3Ag_{0.5}Cu$ solder). Therefore, the adhesive layer 14 is preferably formed of a solder to dissipate heat of the phosphor layer 35. The metal film 35a only needs to be formed on at least part of a contact portion of the peripheral portion of the fluorescent portion 35b with the adhesive layer 14 but is preferably formed on the entire contact portion of the peripheral portion of the fluorescent portion 35b with the adhesive layer 14 to increase thermal conductivity.

Heat generated in the fluorescent portion 35b of the phosphor layer 35 is transmitted through the metal film 35a, the adhesive layer 14, the metal layer 13a and the metal pad 11 each having a high thermal conductivity, and is released mainly from the metal pad 11 or a heat dissipating member (not shown) connected to the metal pad 11. Therefore, it is possible to efficiently release heat of the phosphor layer 35 and thus possible to suppress a decrease in light intensity and variation in emission color of the light-emitting device 30.

The third embodiment may be combined with the second embodiment. In other words, the sidewall 23 in the second embodiment may be used instead of the sidewall 13. In this case, heat generated in the fluorescent portion 35b is transmitted through the metal film 35a, the adhesive layer 14 and the sidewall 23 and is released from a heat dissipating member 27a, 27b or 27c.

Fourth Embodiment

The fourth embodiment is different from the first embodiment in the configuration of the phosphor layer. Note that, the explanation of the same features as those in the first embodiment will be omitted or simplified.

(Configuration of Light-Emitting Device)

Figure 6A:
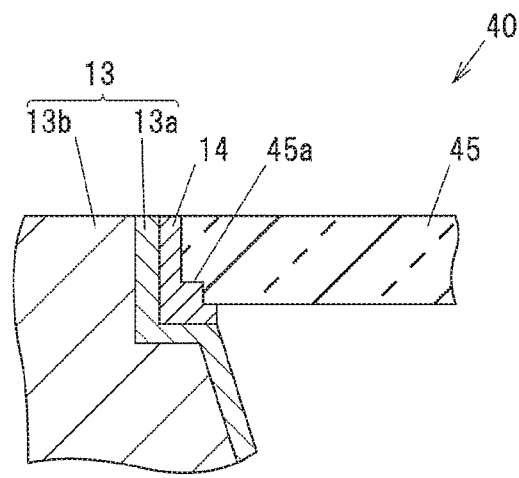
FIG. 6A is a partially enlarged vertical cross sectional view showing a light-emitting device in a fourth embodiment.

FIG. 6A is a partially enlarged vertical cross sectional view showing a light-emitting device in the fourth embodiment. A light-emitting device 40 has the metal pad 11, the LED element 12 mounted on the metal pad 11, the sidewall 13 surrounding the LED element 12 and having the metal layer 13a on a side surface on the LED element 12 side, and a phosphor layer 45 which is fixed to the metal layer 13a of the sidewall 13 via the adhesive layer 14, has a concavo-convex pattern 45a on a surface on the LED element 12 side at a portion in contact with the adhesive layer 14 and is located above the LED element 12. The configuration of the light-emitting device 40 is the same as that of the light-emitting device 10 in the first embodiment, except the phosphor layer.

Figure 6B:
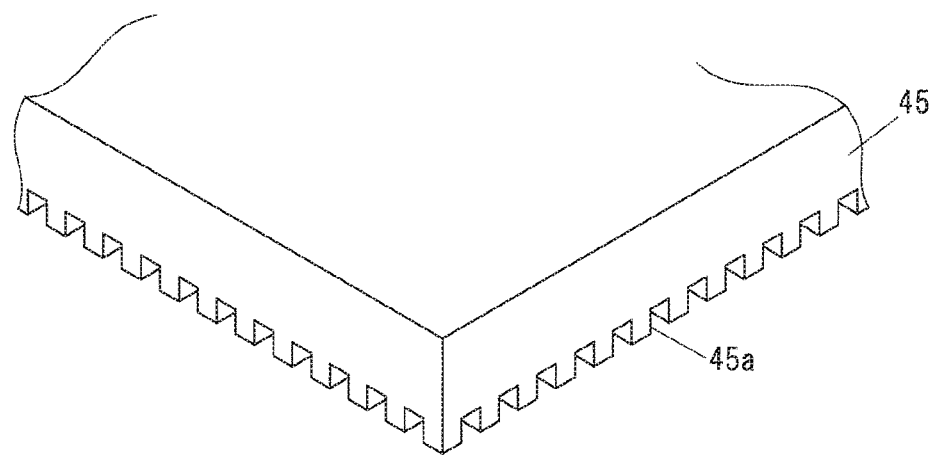
FIG. 6B is a partially enlarged perspective view showing a phosphor layer in the fourth embodiment.

FIG. 6B is a partially enlarged perspective view showing a phosphor layer in the fourth embodiment. The phosphor layer 45 is formed of the same material as the phosphor layer 15 in the first embodiment and has the concavo-convex pattern 45a on a surface on the LED element 12 side (a surface on the lower side in FIG. 6A) at a portion in contact with the adhesive layer 14. A contact area between the adhesive layer 14 and the phosphor layer 45 is increased by providing the concavo-convex pattern 45a on the phosphor layer 45 and adhering the adhesive layer 14 to the concavo-convex pattern 45a, and it is thus possible to efficiently transfer heat of the phosphor layer 45 to the adhesive layer 14.

Unlike the surface irregularity formed on the phosphor layer to improve light extraction efficiency, the concavo-convex pattern 45a has a depth of not less than 10% of the thickness of the phosphor layer (a depth from a top of the peak to the bottom of the recess). The concavo-convex pattern 45a is formed by, e.g., etching the phosphor layer 45. The concavo-convex pattern 45a only needs to be formed on at least part of a contact portion of the phosphor layer 45 with the adhesive layer 14 on a surface on the LED element 12 side but is preferably formed on the entire contact portion of the phosphor layer 45 with the adhesive layer 14 on the surface on the LED element 12 side to increase heat dissipation from the phosphor layer 45.

Heat generated in the phosphor layer 45 is transmitted through the adhesive layer 14, the metal layer 13a and the metal pad 11 each having a high thermal conductivity, and is released mainly from the metal pad 11 or a heat dissipating member (not shown) connected to the metal pad 11. Therefore, it is possible to efficiently release heat of the phosphor layer 45 and thus possible to suppress a decrease in light intensity and variation in emission color of the light-emitting device 40.

The fourth embodiment may be combined with the second embodiment. In other words, the sidewall 23 in the second embodiment may be used instead of the sidewall 13. In this case, heat generated in the phosphor layer 45 is transmitted through the adhesive layer 14 and the sidewall 23 and is released from the heat dissipating member 27a, 27b or 27c.

Fifth Embodiment

The fifth embodiment is different from the first embodiment in the configuration of the phosphor layer. Note that, the explanation of the same features as those in the first embodiment will be omitted or simplified.

(Configuration of Light-Emitting Device)

Figure 7:
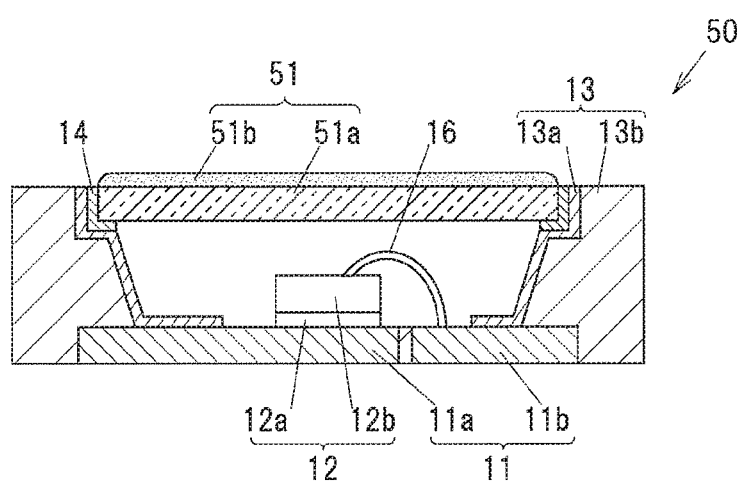
FIG. 7 is a vertical cross sectional view showing a light-emitting device in a fifth embodiment.

FIG. 7 is a vertical cross sectional view showing a light-emitting device in the fifth embodiment. A light-emitting device 50 has the metal pad 11, the LED element 12 mounted on the metal pad 11, the sidewall 13 surrounding the LED element 12, and a phosphor layer 51 fixed to the sidewall 13 via the adhesive layer 14 and located above the LED element 12.

The phosphor layer 51 includes a transparent substrate 51a and a phosphor particle-including resin layer 51b on a surface of the transparent substrate 51a. The phosphor layer 51 may be formed on either an upper surface or a lower surface of the transparent substrate 51a.

The transparent substrate 51a is a substrate which is transparent and has a high thermal conductivity of, e.g., not less than 1 W/(m·K). The thermal conductivity of the transparent substrate 51a is preferably not less than 10 W/(m·K), more preferably not less than 30 W/(m·K).

The base material of the transparent substrate 51a is, e.g., glass, gallium oxide ($Ga_2O_3$), zinc oxide (ZnO), sapphire, silicon carbide (SiC) or diamond which respectively have a thermal conductivity of about 1 W/(m·K), 10 W/(m·K), 25 W/(m·K), 33 W/(m·K), 350 W/(m·K) and 2000 W/(m·K).

In the fifth embodiment, heat generated by phosphor particles is transmitted through the resin including the phosphor particles and is transferred to the transparent substrate 51a. Therefore, the transparent substrate 51a preferably has a higher thermal conductivity than the phosphor layer 15 in the first embodiment in which the phosphor and the base are regarded as an integrated member. In addition, the transparent substrate 51a preferably has a transmittance of not less than 80% at an emission wavelength of the LED element 12 and at a fluorescence wavelength of the phosphor particles included in the resin layer 51b.

The resin constituting the resin layer 51b is a transparent resin such as silicone resin. The phosphor particles included in the resin layer 51b are particles of, e.g., YAG:Ce phosphor. In addition, single crystal phosphor powder manufactured by crushing a single crystal phosphor grown from a melt is preferably used as the phosphor particles included in the resin layer 51b.

According to the specification of Japanese Patent Application No. 2012-099315, thermal quenching of single crystal phosphor grown from a melt is small, and thermal quenching of single crystal phosphor powder formed by crushing such a single crystal phosphor grown from a melt is smaller than that of polycrystalline phosphor powder manufactured by conventional sintering. This causes a light intensity difference of, e.g., about 10% when the temperature of the phosphor is 100° C. Therefore, the single crystal phosphor powder manufactured by crushing a single crystal phosphor grown from a melt is particularly preferable as the phosphor particles included in the resin layer 51b.

After mixing phosphor particles with a resin, the mixture is applied to the upper surface of the transparent substrate 51a and is heated to cure the resin, thereby obtaining the resin layer 51b. When the adhesive layer 14 is formed of, e.g., a solder or silver paste, the transparent substrate 51a is firstly fixed to the sidewall 13 by the adhesive layer 14 and the resin constituting the resin layer 51b is then cured by heat treatment. When the adhesive layer 14 is formed of a high thermal conductivity grease, preferably, the resin constituting the resin layer 51b is cured by heat treatment and the transparent substrate 51a is then fixed to the sidewall 13 by the adhesive layer 14.

Heat generated in the phosphor layer 51 is transmitted through the adhesive layer 14, the metal layer 13a and the metal pad 11 each having a high thermal conductivity, and is released mainly from the metal pad 11 or a heat dissipating member (not shown) connected to the metal pad 11. Therefore, it is possible to efficiently release heat of the phosphor layer 51 and thus possible to suppress a decrease in light intensity and variation in emission color of the light-emitting device 50.

The phosphor layer 51 may be replaced with the phosphor layer 15 of the light-emitting device 20, 20a, 20b, 20c or 20d, the phosphor layer 35 of the light-emitting device 30 or the phosphor layer 45 of the light-emitting device 40. In case of using the phosphor layer 35 as a replacement, the same metal film as the metal film 35a is provided on the peripheral portion of the transparent substrate 51a at a portion in contact with the adhesive layer 14. In case of using the phosphor layer 45 as a replacement, the same concavo-convex pattern as the concavo-convex pattern 45a is provided on a surface of the transparent substrate 51a on the LED element 12 side at a portion in contact with the adhesive layer 14.

Sixth Embodiment

The sixth embodiment is different from the second embodiment in that the phosphor layer is directly connected to the heat dissipating member. Note that, the explanation of the same features as those in the second embodiment will be omitted or simplified.

(Configuration of Light-Emitting Device)

Figure 8A:
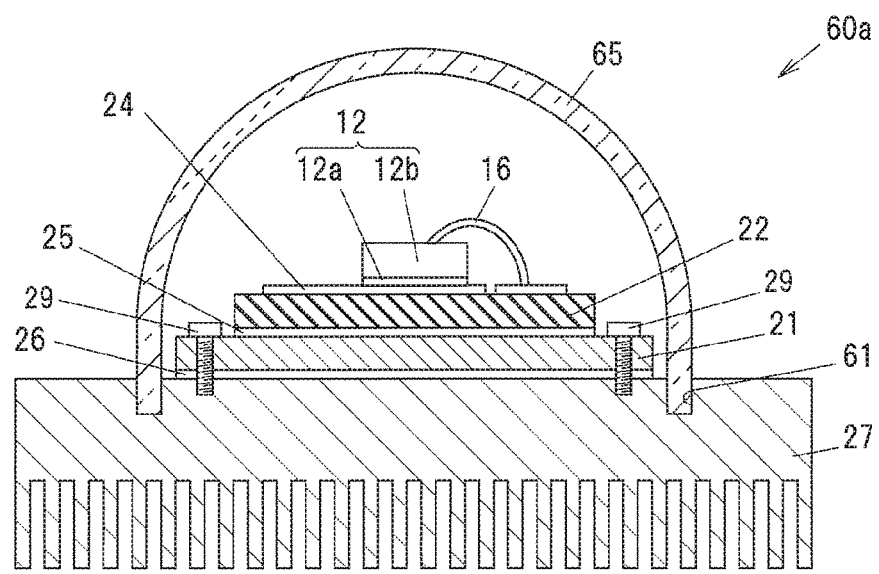
FIG. 8A is a vertical cross sectional view showing a light-emitting device in a sixth embodiment.
Figure 8B:
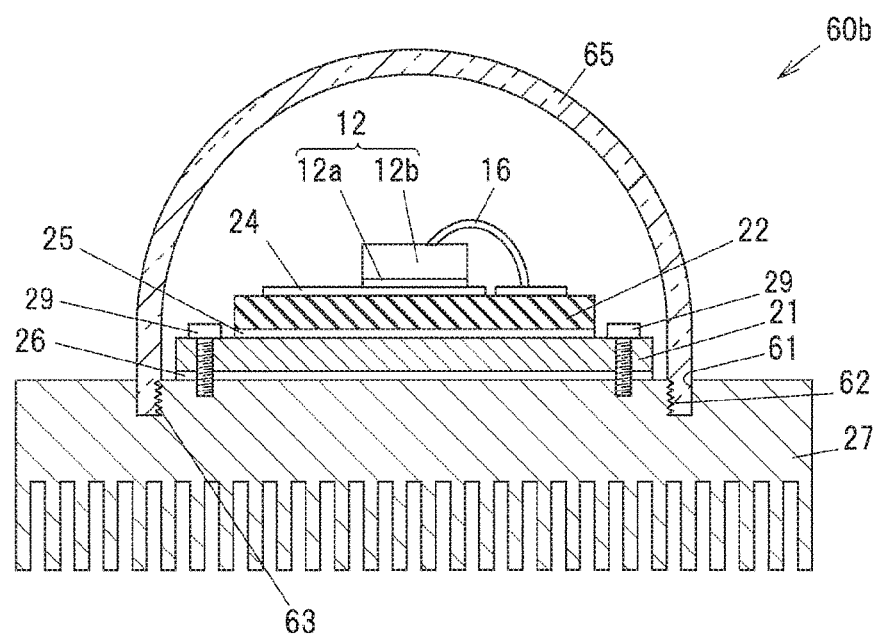
FIG. 8B is a vertical cross sectional view showing a light-emitting device in the sixth embodiment.
Figure 9:
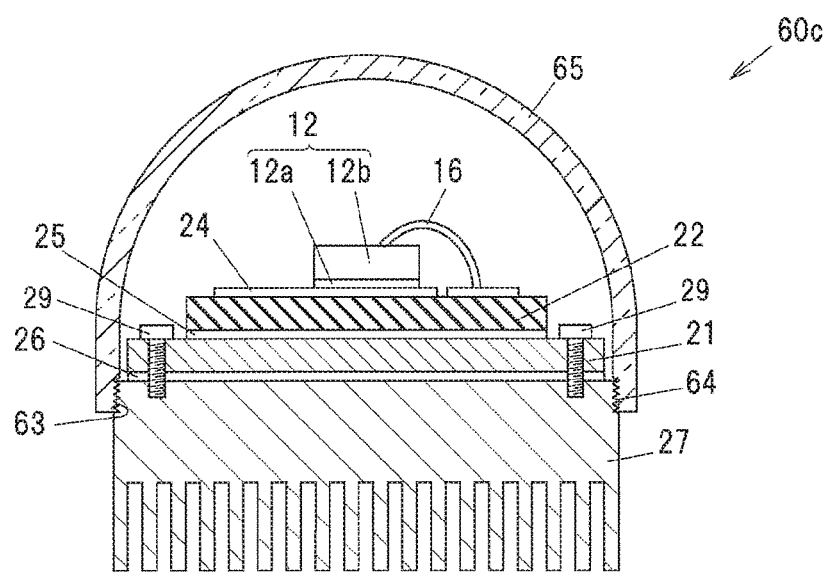
FIG. 9 is a vertical cross sectional view showing a light-emitting device in the sixth embodiment.

FIGS. 8A, 8B and 9 are vertical cross sectional views showing light-emitting devices in the sixth embodiment. Each of light-emitting devices 60a, 60b and 60c has the metal plate 21, the insulating substrate 22 placed on the metal plate 21, the LED element 12 mounted on the insulating substrate 22, the dissipating member 27 such as heat sink, and a phosphor layer 65 which covers the upper and lateral sides of the LED element 12 and is directly connected to the dissipating member 27.

The insulating substrate 22 is fixed onto the metal plate 21 by the adhesive layer 25. The wiring pattern 24 formed of a metal such as Ag or Au is formed on the upper surface of the insulating substrate 22. The LED element 12 is connected to the wiring pattern 24 via the wire 16 and an electrode (not shown) formed on the bottom surface of the crystal layer 12a. The metal plate 21 is fixed to the heat dissipating member 27 by, e.g., the screws 29. The high thermal conductivity grease 26 is applied between the metal plate 21 and the heat dissipating member 27.

The phosphor layer 65 has, e.g., a dome shape and is formed of a single crystal phosphor, a ceramic phosphor, glass including phosphor particles or a transparent resin including phosphor particles. Alternatively, the phosphor layer 65 may be configured in the same manner as the phosphor layer 51 in the fifth embodiment. In the light-emitting devices 60a, 60b and 60c, heat generated in the phosphor layer 65 is directly transferred to the heat dissipating member 27 and is released from the heat dissipating member 27.

In the light-emitting device 60a shown in FIG. 8A, a lower portion of the phosphor layer 65 is fitted to a circular groove 61 which is formed on the upper surface of the heat dissipating member 27 so as to surround the metal plate 21, and the phosphor layer 65 is thereby fixed to the heat dissipating member 27. In case that the phosphor layer 65 is configured in the same manner as the phosphor layer 51 in the fifth embodiment, a lower portion of the transparent substrate 51a is fitted to the groove 61, to be more precise.

In the light-emitting device 60b shown in FIG. 8B, a threaded groove 62 is formed on an inner side surface of the groove 61 and a threaded groove 63 corresponding to the threaded groove 62 is formed on an inner side surface of the lower portion of the phosphor layer 65, so that the phosphor layer 65 is fixed to the heat dissipating member 27 by screwing the lower portion of the phosphor layer 65 into the groove 61 of the heat dissipating member 27. Alternatively, the threaded groove 62 may be formed on an outer side surface of the groove 61 and the threaded groove 63 on an outer side surface of the lower portion of the phosphor layer 65. In case that the phosphor layer 65 is configured in the same manner as the phosphor layer 51 in the fifth embodiment, the threaded groove 63 is formed on a side surface of the lower portion of the transparent substrate 51a, to be more precise.

In the light-emitting device 60c shown in FIG. 9, a threaded groove 64 is formed on a side surface of the upper portion of the heat dissipating member 27 and the threaded groove 63 corresponding to the threaded groove 64 is formed on an inner side surface of the lower portion of the phosphor layer 65, so that the phosphor layer 65 is fixed to the heat dissipating member 27 by screwing the lower portion of the phosphor layer 65 into the groove 61 of the heat dissipating member 27. In case that the phosphor layer 65 is configured in the same manner as the phosphor layer 51 in the fifth embodiment, the threaded groove 63 is formed on an inner side surface of the lower portion of the transparent substrate 51a, to be more precise.

Effects of the Embodiments

According to the first to sixth embodiments described above, by providing a heat dissipation path to efficiently release heat of the phosphor layer, it is possible to suppress a decrease in light intensity and variation in emission color of the light-emitting device which are caused by thermal quenching of the phosphor. In addition, when the phosphor layer is formed of a single crystal phosphor, a ceramic phosphor or glass including phosphor particles and the phosphor layer itself has a high thermal conductivity, it is possible to dissipate heat more efficiently.

EXAMPLES

Figure 10:
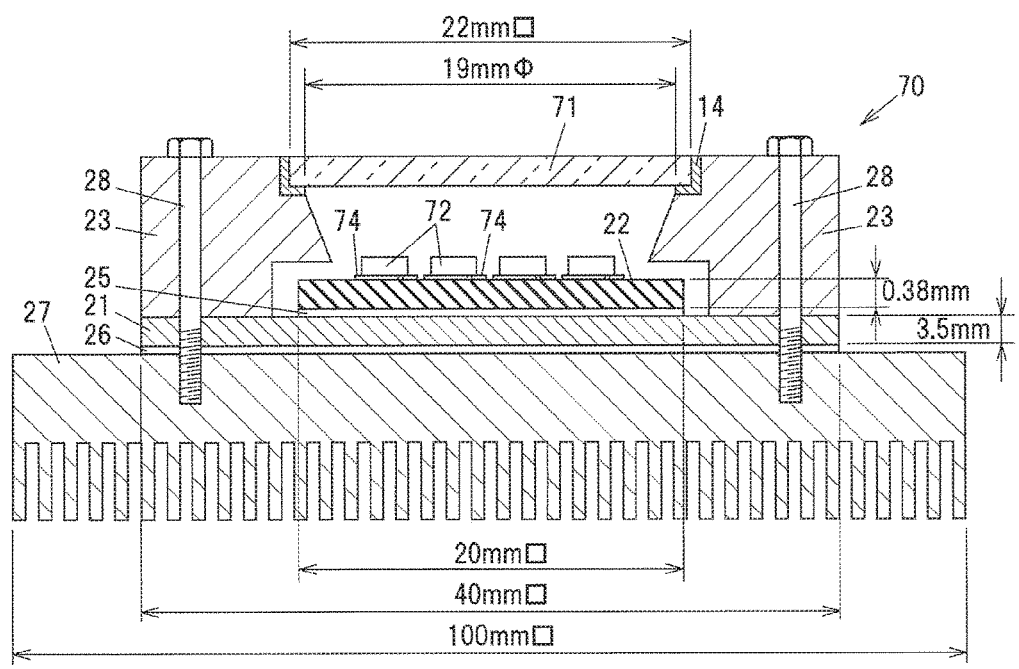
FIG. 10 is a vertical cross sectional view showing a light-emitting device in Example.

FIG. 10 is a vertical cross sectional view showing a light-emitting device in Example. In this Example, a light-emitting device 70 shown in FIG. 10 was used to examine the effect of the configuration of the phosphor layer or the material of the adhesive layer on temperature of the phosphor layer.

The light-emitting device 70 has the metal plate 21, the insulating substrate 22 placed on the metal plate 21, LED elements 72 mounted on the insulating substrate 22, the sidewall 23 surrounding the LED elements 72 and fixed to the heat dissipating member 27 as heat sink by the screws 28 via the metal plate 21, and a phosphor layer 71 fixed to the sidewall 23 directly or via the adhesive layer 14 and located above the LED elements 12.

The adhesive layer 14 is formed of a high thermal conductivity grease having a thermal conductivity of 3 W/(m·K).

The insulating substrate 22 is fixed onto the metal plate 21 by the adhesive layer 25 formed of a SuAgCu solder. The insulating substrate 22 is formed of MN and has a thickness of 0.38 mm. The planar shape of the insulating substrate 22 is a square with dimensions of 20 mm×20 mm.

The LED element 72 is a flip-chip type LED element and is connected to the wiring pattern 24 on the insulating substrate 22. The planar shape of the LED element 72 is a square with dimensions of 1 mm×1 mm, and the LED elements 72 are arranged in a matrix with 8 rows and 8 columns (sixty-four in total) on the insulating substrate 22.

The metal plate 21 is formed of Cu and has a thickness of 3.5 mm. The planar shape of the metal plate 21 is a square with dimensions of 40 mm×40 mm. The high thermal conductivity grease 26 is applied between the metal plate 21 and the heat dissipating member 27. In the light-emitting device 70, the metal plate 21 and the high thermal conductivity grease 26 have a thermal conductivity of not less than 1 W/m·K and thus can be regarded as a part of the heat dissipating member. In other words, the metal plate 21, the high thermal conductivity grease 26 and the heat dissipating member 27 constitute one heat dissipating member.

The sidewall 23 is formed of Al. The sidewall 23 has a circular opening. Therefore, a region of the lower surface of the phosphor layer 71 exposed on the LED element 72 side is circular.

The planar shape of the heat dissipating member 27 is a square with dimensions of 100 mm×100 mm.

The phosphor layer 71 is a phosphor-including resin plate such as a resin plate including sintered YAG phosphor particles (the mass ratio of resin:sintered YAG phosphor particles=150:200), a combination of a glass substrate with a resin including sintered YAG phosphor particles thereon (the mass ratio of resin:sintered YAG phosphor powder=150:200), a combination of a sapphire substrate with a resin including YAG powder phosphor particles thereon (the mass ratio of resin:sintered YAG phosphor particles=150:200), or a YAG single crystal phosphor plate.

The planar shape of the phosphor layer 71 is a square with dimensions of 22 mm×22 mm, and a region of the lower surface thereof exposed on the LED element 72 side, i.e., a region contributing to wavelength conversion has a circular shape with a diameter of 19 mm. Therefore, the area of the region of the phosphor layer 71 contributing to wavelength conversion is 2.8 [cm$^2$]. The phosphor layer 71 has a thickness of 1 mm. The light-emitting device 70 was adjusted to emit white light with a correlated color temperature of 5000K.

Table 1 shows the configurations of seven light-emitting devices (Samples 1 to 7) used to evaluate the present Example and the measured values of temperature in the vicinity of the center of the phosphor layer 71 during light emission.

powder thereon was used as the phosphor layer 71, temperature was kept around 100° C. at the light radiation flux density [W/cm$^2$] of 1.8 [W/cm$^2$].

Based on comparisons between the results of Sample 2 and Sample 3, between the results of Sample 4 and Sample 5 and between the results of Sample 6 and Sample 7, it can be confirmed that it is possible to greatly reduce the temperature of the phosphor layer 71 by providing the adhesive layer 14. In addition, based on another experiment conducted in the same manner as the present Example, it was

TABLE 1

| Sample No. | Configuration of phosphor layer | Existence of adhesive layer | Total radiation flux [W] | Light radiation flux density [W/cm$^2$] | Temperature of phosphor layer [° C.] |
|---|---|---|---|---|---|
| 1 | phosphor-including resin plate | without | 5.0 | 1.8 | X |
|   |   |   | 16.6 | 5.9 | X |
|   |   |   | 28.3 | 10.1 | X |
|   |   |   | 43.9 | 15.7 | X |
| 2 | glass substrate & phosphor-including resin | without | 5.0 | 1.8 | 108 |
|   |   |   | 16.6 | 5.9 | X |
|   |   |   | 28.3 | 10.1 | X |
|   |   |   | 43.9 | 15.7 | X |
| 3 | same as above | with | 5.0 | 1.8 | 101 |
|   |   |   | 16.6 | 5.9 | X |
|   |   |   | 28.3 | 10.1 | X |
|   |   |   | 43.9 | 15.7 | X |
| 4 | sapphire substrate & phosphor-including resin | without | 5.0 | 1.8 | 47 |
|   |   |   | 16.6 | 5.9 | 98 |
|   |   |   | 28.3 | 10.1 | X |
|   |   |   | 43.9 | 15.7 | X |
| 5 | same as above | with | 5.0 | 1.8 | 34 |
|   |   |   | 16.6 | 5.9 | 52 |
|   |   |   | 28.3 | 10.1 | 74 |
|   |   |   | 43.9 | 15.7 | 122 |
| 6 | single crystal phosphor plate | without | 5.0 | 1.8 | 45 |
|   |   |   | 16.6 | 5.9 | 92 |
|   |   |   | 28.3 | 10.1 | X |
|   |   |   | 43.9 | 15.7 | X |
| 7 | same as above | with | 5.0 | 1.8 | 35 |
|   |   |   | 16.6 | 5.9 | 49 |
|   |   |   | 28.3 | 10.1 | 71 |
|   |   |   | 43.9 | 15.7 | 113 |

"Total radiation flux [W]" in Table 1 is the total radiation flux emitted by the LED elements 72 and each sample was evaluated with various total radiation fluxes. Meanwhile, "Light radiation flux density [W/cm$^2$]" is a radiation flux density of light emitted from the LED elements 72 and incident on the phosphor layer 71 and was obtained by dividing "Total radiation flux [W]" by an area, 2.8 [cm$^2$], of the region of the phosphor layer 71 contributing to wavelength conversion.

In Table 1, "Temperature of phosphor layer [° C.]" is temperature in the vicinity of the center of the phosphor layer 71 during light emission, and "×" indicates temperature of more than 150° C. 150° C. is used as a criterion since junction temperature of the LED element 72 was up to about 120 to 150° C.

Table 1 shows that heat was dissipated most effectively when using a single crystal phosphor plate as the phosphor layer 71 and heat dissipation was the least when using a phosphor-including resin plate.

Meanwhile, a difference in heat dissipation characteristics between Sample 2 and Sample 4 is considered to be due to a difference between thermal conductivity of the sapphire substrate of Sample 4 (33 W/(m·K)) and thermal conductivity of the glass substrate of Sample 2 (1 W/(m·K)). Also in Samples 2 and 3 in which a combination of a glass substrate with a resin including sintered YAG phosphor confirmed that it is possible to greatly reduce the temperature of the phosphor layer 71 even when the high thermal conductivity grease having a thermal conductivity of 1 W/(m·K) is used as the adhesive layer 14. These results show that thermal conductivity of the adhesive layer 14 should be not less than 1 W/(m·K) and is preferably not less than 3 W/(m·K).

In the present Example, a portion of the lower surface of the phosphor layer 71 in contact with the adhesive layer 14 has an area of 22$^2$–π(19/2)$^2$ cm$^2$ and a percentage thereof relative to the area, π(19/2)$^2$ cm$^2$, of the region contributing to wavelength conversion is 70%. In addition, in another experiment conducted in the same manner as the present Example, reduction in temperature of the phosphor layer 71 due to the adhesive layer 14 was observed when the percentage was not less than 35%. These results show that a percentage of the area of the lower surface of the phosphor layer 71 in contact with the adhesive layer 14 relative to the entire area should be not less than 35%, and is preferably not less than 70%.

Meanwhile, when another experiment was conducted in the same manner as the present Example using a phosphor layer formed of a glass plate including sintered YAG phosphor powder, it was confirmed that a temperature exhaust effect at the level between Sample 3 and Sample 4 was obtained.

In order to easily dissipate heat of the phosphor layer 71 which is composed of a transparent substrate and a resin layer including phosphor particles formed thereon, it is required to reduce the thickness of the resin layer so that heat in the resin layer can be easily transferred to the transparent substrate. To reduce the thickness of the resin layer while keeping an emission color of the light-emitting device 70 constant, it is necessary to increase a concentration of phosphor particles in the resin layer.

In the present Example, the mass concentration of the phosphor particles in the resin layer of Samples 2 to 5 is 57 mass %. Then, based on another experiment conducted in the same manner as the present Example, it was confirmed that it is possible to effectively dissipate heat of the phosphor layer 71 when the mass concentration is not less than 50 mass %.

Although the embodiments of the invention have been described above, the invention is not intended to be limited to these embodiments, and the various kinds of modifications can be implemented without departing from the gist of the invention. For example, the light-emitting device may have plural different heat dissipating members in any forms described in the embodiments. In other words, the heat dissipating member of the light-emitting device may be composed of plural different members in any forms. In addition, the constituent elements of the embodiments can be arbitrarily combined without departing from the gist of the invention.

In addition, the invention according to claims is not to be limited to embodiments. Further, it should be noted that all combinations of the features described in the embodiments are not necessary to solve the problem of the invention.

INDUSTRIAL APPLICABILITY

The invention provides a light-emitting device which is suitable for a lighting apparatus, such as a projector, requiring high brightness and high light intensity, exhibits little change in light emission color and a low reduction in light emission intensity during usage, and uses a remote phosphor.

REFERENCE SIGNS LIST 10, 20, 20a, 20b, 20c, 20d, 30, 40, 50, 60, 60a, 60b, 60c, 70: LIGHT-EMITTING DEVICE
11: METAL PAD
12, 72: LED ELEMENT
13, 23: SIDEWALL
13a: METAL LAYER
13b: BASE
14: ADHESIVE LAYER
15, 35, 45, 51, 65, 71: PHOSPHOR LAYER
21: METAL PLATE
27a, 27b, 27c, 82, 83: HEAT DISSIPATING MEMBER
35a: METAL FILM
45a: CONCAVO-CONVEX PATTERN
51a: TRANSPARENT SUBSTRATE
51b: RESIN LAYER
61: GROOVE
62, 63, 64: THREADED GROOVE

The invention claimed is:

1. A light-emitting device, comprising:
a light-emitting element for emitting a bluish light;
a plate-shaped phosphor layer for converting the bluish light to a yellowish light by a predetermined ratio, the phosphor layer being placed away from the light-emitting element; and
a heat dissipating member that dissipates heat generated in the phosphor layer,
wherein the phosphor layer emits a light ranging from blue color to yellow color in accordance with the predetermined conversion ratio thereof,
wherein the phosphor layer comprises a single crystal phosphor, a ceramic phosphor or a glass including phosphor particles, and
wherein the heat generated in the phosphor layer is transmitted through a metal film formed of Ag, or a metal alloy comprising Ag, and an adhesive layer adhered to the heat dissipating member, wherein the adhesive layer has a thermal conductivity of not less than 1 W/(m·K).

2. The light-emitting device, according to claim 1, wherein the adhesive layer is formed of a solder.

3. A light-emitting device, comprising:
a light-emitting element for emitting a bluish light;
a plate-shaped phosphor layer for converting the bluish light to a yellowish light by a predetermined ratio, the phosphor layer being placed away from the light-emitting element;
a heat dissipating member that dissipates heat generated in the phosphor layer;
a reflecting member for reflecting the bluish light from the light-emitting element in a direction of the phosphor layer, and/or the yellowish light from the phosphor layer back to the phosphor layer,
wherein the phosphor layer comprises a single crystal phosphor, a ceramic phosphor or a glass including phosphor particles, and
wherein the heat generated in the phosphor layer is transmitted through a metal film formed of Ag, or a metal alloy comprising Ag, and an adhesive layer adhered to the heat dissipating member, wherein the adhesive layer has a thermal conductivity of not less than 1 W/(m·K).

4. The light-emitting device, according to claim 3, wherein:
the reflecting member comprises a horizontal portion for reflecting the yellowish light from the phosphor layer back to the phosphor layer.

5. The light-emitting device, according to claim 4, wherein:
the reflecting member further comprises a slanting portion for reflecting the yellowish light from the phosphor layer back to the phosphor layer.

6. The light-emitting device, according to claim 4, wherein:
the reflecting member further comprises a vertical portion for reflecting the yellowish light from the phosphor layer back to the phosphor layer.

7. The light-emitting device, according to claim 6, wherein:
the horizontal portion is provided along an outer edge of the phosphor layer, and the vertical portion is provided along a side surface of the phosphor layer.

8. The light-emitting device, according to claim 6, wherein:
the reflecting member is of a common metal sheet placed on the heat dissipating member.

9. The light-emitting device, according to claim 7, wherein:

the phosphor layer is supported by a top opening of the reflecting member.

10. A light-emitting device, comprising:

a light-emitting element for emitting a bluish light;

a plate-shaped phosphor layer for converting the bluish light to a yellowish light by a predetermined ratio, the phosphor layer being placed away from the light-emitting element;

a first heat dissipating member configured to dissipate heat generated in the phosphor layer; and a second heat dissipating member configured to dissipate heat generated by the light-emitting element, wherein the heat generated in the phosphor layer is transmitted through a metal film formed of Ag, or a metal alloy comprising Ag, and an adhesive layer adhered to the first heat dissipating member, wherein the adhesive layer has a thermal conductivity of not less than 1 W/(m·K).

11. The light-emitting device according to claim 10, wherein the adhesive layer is formed of a solder.

12. The light-emitting device according to claim 10, wherein the phosphor layer comprises a single crystal phosphor, a ceramic phosphor, or a glass including phosphor particles.

13. The light-emitting device according to claim 11, wherein the phosphor layer comprises a single crystal phosphor, a ceramic phosphor, or a glass including phosphor particles.

14. The light-emitting device according to claim 10, wherein the light-emitting element is a face-down type LED comprising a substrate and a crystal layer, and wherein the crystal layer is positioned on the second heat dissipating member opposite to the phosphor layer.

* * * * *